United States Patent [19]

Nishijima

[11] Patent Number: 5,254,956
[45] Date of Patent: Oct. 19, 1993

[54] COMPOSITE DIFFERENTIAL AMPLIFIER

[75] Inventor: Kazunori Nishijima, Tokyo, Japan

[73] Assignee: NEC Corporation, Tokyo, Japan

[21] Appl. No.: 889,044

[22] Filed: May 29, 1992

[30] Foreign Application Priority Data

May 29, 1991 [JP] Japan .................... 3-125752

[51] Int. Cl.$^5$ ............................................. H03F 3/45
[52] U.S. Cl. ................................... 330/258; 330/259
[58] Field of Search ............... 330/69, 85, 258, 259, 330/260

[56] References Cited

U.S. PATENT DOCUMENTS 3,786,362 1/1974 Marsh et al. ................ 330/258
4,105,942 8/1978 Henry .......................... 330/69 X
4,701,719 10/1987 Nagata ........................ 330/258

FOREIGN PATENT DOCUMENTS 286347 10/1988 European Pat. Off. .

OTHER PUBLICATIONS

De la Plaza et al. "Power-Supply Rejection in Differential Switched-Capacitor Filters", *IEEE Journal of Solid-State Circuits*, vol. SC-19, No. 6, Dec. 1984, pp. 912-918.

*Primary Examiner*—James B. Mullins
*Attorney, Agent, or Firm*—Laff, Whitesel, Conte & Saret

[57] ABSTRACT

There is provided a composite differential amplifier with a lower voltage and a lower power consumption of the circuit thereof. An output of a differential amplifier is inputted into an emitter-follower and is delivered as a DC voltage from an emitter of each of transistors of the emitter-follower to a non-inverting input terminal or an operational amplifier. Then, an output of the operational amplifier is supplied to a variable current source. The variable current source at its current drain side is connected to a resistance side of the differential amplifier so that an external control voltage inputted to the non-inverting input side of the operational amplifier is equal to the DC output voltage of the differential amplifier.

9 Claims, 3 Drawing Sheets

COMPOSITE DIFFERENTIAL AMPLIFIER

BACKGROUND OF THE INVENTION

The invention relates to a composite differential amplifier and more particularly to a composite differential amplifier which enables an output DC voltage of the differential amplifier to be constant.

The conventional composite differential amplifier, as shown in FIG. 1, comprises a differential amplifier, an emitter-follower, resistances 207 and 208 and an operational amplifier 215. The differential amplifier comprises an input signal source 214, transistors 201 and 202, resistances 205 and 206 and a constant current source 212. The emitter follower comprises transistors 203 and 204 and constant current sources 210 and 211.

An operation of the above mentioned composite differential amplifier will hereinafter fully be described in detail with reference to the accompanying drawings.

Referring to FIG. 1, a signal $v_i$ generated by the input signal source 214 is amplified by the differential amplifier. The amplified signal is fed to the base of each of the transistors 203 and 204 of the emitter-follower. The each signal is further amplified by the transistors 203 and 204 and is delivered from each of the emitter thereof. Thus, the emitter output voltage $V_o$ is given by $$V_O = V_{OP} - R_L I_O - A v_i - Y_{Be} \quad (1).$$

where A is the gain of the differential amplifier, $2I_O$ is the current value of the constant current source 212, $R_L$ is the resistance value of the resistance 205, $V_{OP}$ is the output voltage of the operational amplifier 215, $V_{BE}$ is the voltage between base and emitter of the transistors 203.

While an output voltage $V_O'$ of the emitter of the transistor 204 is also given by $$V_O' = V_{OP} - R_L I_O + A v_i - V_{BE} \quad (2).$$

where A is the gain of the differential amplifier, $2I_O$ is the current value of the constant current source 212, $R_L$ is the resistance value of the resistance 206, $V_{OP}$ is the output voltage of the operational amplifier 215 and $V_{BE}$ is the voltage between base and emitter of the transistor 204.

Since the resistance value of the resistance 207 is equal to the resistance value of the resistance 208, an inverting input voltage $V_i$ of the operational amplifier 215 is the middle-point-voltage between the emitter output voltage $V_O$ of the transistor 203 and the emitter output voltage $V_O'$ of the transistor 204. Then, the inverting input voltage $V_1$ is given by $$V_i = \frac{V_O + V_O'}{2} = V_{OP} - R_L I_O - V_{BE} \quad (3)$$

It may therefore be understood from the equation (4) that the inverting input voltage $V_i$ is the output DC voltage which is delivered from the differential amplifier through the emitter-follower. Then, the output voltage $V_{OP}$ of the operational amplifier is given by $$A_{OP}(V_C - V_i) = V_{OP} \quad (4).$$

where $A_{OP}$ is the open-gain of the operational amplifier, $V_C$ is the external control voltage of the operational amplifier 215, $V_i$ is the inverting input voltage of the operational amplifier 215.

The following equation (5) is obtained by substituting the above equation (3) in the above equation (4).

$$A_{OP}(V_C - V_i) = V_i + R_L I_O + V_{BE} \quad (5).$$

Then, the output DC voltage from the differential amplifier is given by $$V_i = \frac{A_{OP} V_C - R_L I_O - V_{BE}}{1 + A_{OP}} \quad (6)$$

$$= \frac{A}{1 + A_{OP}} \cdot V_C - \frac{R_L I_O + V_{BE}}{1 + A_{OP}}$$

Assuming that the open-gain $A_{OP}$ of the operational amplifier 215 is considerably large, the following equation is obtained. When the gain A of the operational amplifier is considerably large, the equation (6) is made to the following equation (7):

$$V_i \approx V_C \quad (7).$$

Consequently, the output DC voltage of the differential amplifier is nearly equal to the external control voltage with independence from values of the resistance $R_L$, the current $I_O$ and the base-emitter voltage $V_{BE}$. It therefore may be assumed that the external control voltage $V_C$ may be regulated to be constant by the regulators so as to obtain the constant output DC voltage of the differential amplifier.

In the conventional composite differential amplifier, the output of the operational amplifier 215 serves as a power supply of the differential amplifier. Thus, a high output DC voltage $V_{DC}$ of the differential amplifier may be set with a higher output voltage $V_{OP}$ of the operational amplifier, whereby a source voltage of the operational amplifier is needed to be much higher than the output voltage $V_{OP}$ of the operational amplifier. Further, all circuit currents of the composite differential amplifier are supplied with only the output of the operational amplifier to substantially increase a power consumption of the operational amplifier with a higher external control voltage of the operational amplifier, whereby it is impossible to lower the operational amplifier voltage.

SUMMARY OF THE INVENTION

An object of the present invention is to provide a composite differential amplifier which is free of a high output voltage of the operational amplifier, increase of power consumption thereof and a high external control voltage thereof.

A composite differential amplifier comprises a power supply for supplying a power to a circuit, a differential amplifier for amplifying a voltage signal inputted from an input signal source, an emitter-follower connected to an output side of said differential amplifier for converting the voltage signal inputted from the differential amplifier into a DC voltage and for amplifying the voltage outputted from the differential amplifier, an operational amplifier connected to an output side of the emitter-follower for amplifying the DC voltage outputted from the emitter-follower, and a variable current source connected to an output side of the operational amplifier and connected to the output side of the differential amplifier for controlling a voltage of the output side of the differential amplifier in response to an output of the operational amplifier.

BRIEF DESCRIPTION OF THE DRAWINGS

Preferred embodiment of a composite differential amplifier according to the invention will hereinafter fully be described in detail with reference to the accompanying drawings.

PREFERRED EMBODIMENTS OF THE INVENTION

Figure 1:
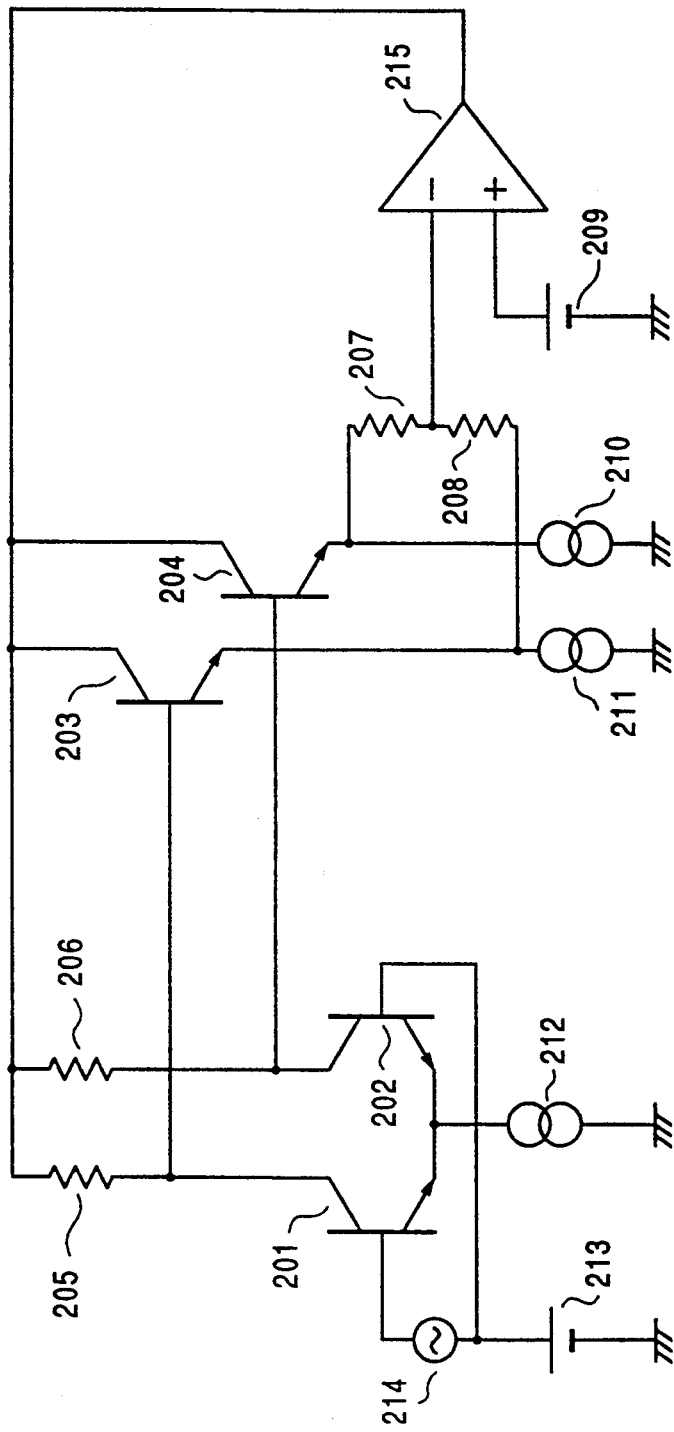
FIG. 1 is a circuit diagram of the conventional composite differential amplifier.
Figure 2:
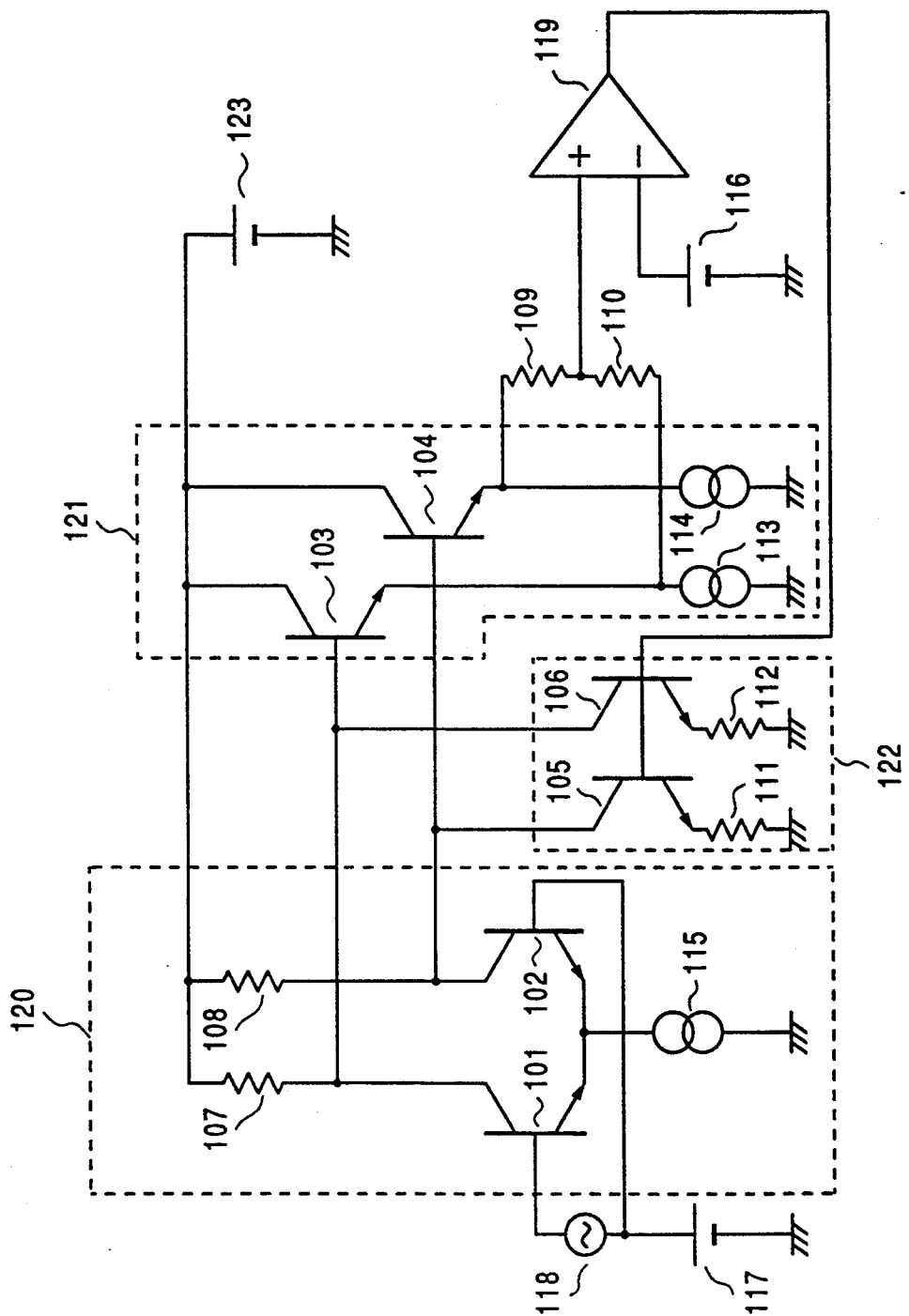
FIG. 2 is a circuit diagram of one embodiment of a composite differential amplifier according to the invention.

In FIG. 2, a composite differential amplifier comprises a differential amplifier 120, an emitter-follower 121, a variable current source 122, an operational amplifier 119, resistances 109 and 110 and a power supply voltage 123. The differential amplifier further comprises an input signal source 118, transistors 101 and 102, resistances 107 and 108, a constant current source 115 and an input bias voltage source 117. The emitter-follower comprises transistors 103 and 104, constant current sources 113 and 114. The variable current source comprises transistors 105 and 106 and resistances 111 and 112. The resistances 109 and 110 may serve to provide the operational amplifier with a middle-point-voltage of the differential output voltage of the emitter-follower 121.

An input signal voltage $v_i$ of the input signal source 118 is amplified by the differential amplifier 120 and outputted from each emitters of the transistors 103 and 104 through the emitter-follower 121.

An emitter output voltage $V_O''$ of the transistor 103 is given by $$V_O'' = V_{CC} - R_L'(I_O' + I_{CX}) - A'v_i' - V_{BE}' \quad (8)$$

where $A'$ is the gain of the differential amplifier, $2I_O'$ is the current of the constant current source 115 is, $R_L'$ is the resistance value of the resistances 107 and 108, $V_{OP}'$ is the output voltage of the operational amplifier 119, $V_{BE}$ is the voltage between base and emitter of the transistor 103, $V_{CC}$ is the voltage of the power supply 123 and $I_{CX}$ is the current of the variable current source 122, or the corrector current of the transistor 105.

And an emitter output voltage $V_O'''$ of the transistor 104 is given by $$V_O''' = V_{CC} - R_L'(I_O' + I_{OX}) + A'v_i' - V_{BE}' \quad (9)$$

where $A'$ is the gain of the differential amplifier, $2I_O'$ is the current of the constant current source 115, $R_L'$ is the resistance value of the resistance 108, $V_{OP}$ is the output voltage of the operational amplifier 119, $V_{BE}$ is the voltage between base and emitter of the transistor 104, $V_{CC}$ is the voltage of the power supply 123, $I_{CX}$ is the current of the variable current source 122, or the corrector current of the transistor 105.

Accordingly, an input voltage $V_i'$ of the non-inverting input of the operational amplifier 119 is a middle-point-voltage between the emitter output voltage $V_O''$ of the transistor 103 and the emitter output voltage $V_O'''$ of the transistor 104 in which the values of resistances 109 and 110 are equal to each other. Thus, the input voltage $V_i'$ of the non-inverting input of the operational amplifier is given by $$V_i' = \frac{V_O'' + V_O'''}{2} \quad (10)$$

$$= V_{CC} - R_L'(I_O' + I_{CX}) - V_{BE}'$$

Namely, the non-inverting input voltage $V_i'$ is an output DC voltage of the differential amplifier 120 which has been delivered through the emitter-follower 121.

Further, an output voltage $V_{OP}'$ of the operational amplifier 119 is given by $$A_{OP}'(V_i' - V_C') = V_{OP}' \quad (11)$$

where $A_{OP}'$ is the open-gain of the operational amplifier 119, $V_i'$ is the non-inverting input voltage of the operational amplifier 119, $V_C'$ is the external control voltage of the operational amplifier 119.

The corrector current $I_{CX}$ of the transistors 105 and 106 is given by $$I_{CX} = \frac{V_{OP}' - V_{BE}''}{R_E} \quad (12)$$

The equation (11) is substituted to the following equation (12) whereby the corrector current $I_{CX}$ is replaced with $$I_{CX} = \frac{A_{OP}'(V_i' - V_C') - V_{BE}''}{R_E} \quad (13)$$

And further, the equation (13) is substituted to the equation (10) whereby the non-inverting input voltage $V_i'$ is given by $$V_i' = V_{CC} - R_L'I_O' + \frac{A_{OP}'(V_i' - V_C')}{R_E} - V_{BE}' \quad (14)$$

The equation (14) is replaced with the following equation (15) to obtain the non-inverting output voltage $V_i'$ which is given by $$V_i' = \frac{V_{CC} - R_L'I_O' + \frac{R_L'}{R_E} \cdot A_{OP}' \cdot V_C' - V_{BE}'}{\left(1 + \frac{R_L'}{R_E} \cdot A_{OP}\right)} \quad (15)$$

$$= \frac{\frac{V_{CC} - R_L'I_O' - V_{BE}'}{A_{OP}'} + \frac{R_L'}{R_E} \cdot V_C'}{\frac{1}{A_{OP}'} + \frac{R_L'}{R_E}}$$

Assuming that the gain $A_{OP}'$ of the operational amplifier 117 is considerably large, the equation (15) may be replaced with $$V_i' \simeq V_c' \quad (16).$$

It is of course understood that the output DC voltage of the differential amplifier is nearly equal to the external control voltage $V_O'$.

As is clear from the set forth description, in the composite differential amplifier according to the invention, the output of the operational amplifier is connected to the resistance side of the differential amplifier through the variable current source so that when the high output DC voltage of the differential amplifier is set, set of the high output voltage $V_{OP}$ of the operational amplifier is unnecessary. The operational amplifier may also be operated by the power supply voltage of the differential amplifier. Circuit currents of the differential amplifier are supplied with only the power supply so that the output current of the operational amplifier and power consumption thereof may not be increased. Further, a high voltage for the operational amplifier is unnecessary. These allow lowering conveniently all consumer voltage of the circuit including the operational amplifier.

The above advantages of the invention will hereinafter concretely be described, as compared with the prior arts. In the conventional differential amplifier, it is assumed that the resistance values of the resistances 205 and 206 are 5 kΩ, the current values of the constant current sources 210, 211 and 212 are 400 μA, the voltage between base and emitter of each of the transistors 203 and 204 is 0.7 V and the current consumption of the operational amplifier is 1 mA. When the external control voltage $V_C$ is 2.8 V, the output DC voltage $V_{DC}$ of the differential amplifier which has been delivered through the emitter-follower may be kept at 2.8 V. In this case, the output voltage $V_{OP}$ of the operational amplifier is 4.5 V. Thus, the supply voltage only of the operational amplifier is needed to be at least 8 V. The output current of the operational amplifier is the sum of the current of each of the differential amplifier, the emitter-follower and the operational amplifier. Then, the output current of the operational amplifier is given by $$400(\mu A) \times 3 + 1(mA) = 2.2(mA).$$

Consequently, the all power consumption of the circuit is given by $$2.2(mA) \times 8(V) = 17.6(mW).$$

On the other hand, in the embodiment of the composite differential amplifier according to the invention, it is assumed that the voltage of the power supply 123 is 5 V, the resistance value of each of the resistances 107 and 108 is 5 kΩ, the current of each of the constant current sources 113, 114 and 115 is 400 μA, the current of the variable current source is 100 μA, the voltage between base and emitter of each of the transistors 105 and 106 is 0.7 V and the resistance values of the resistances 111 and 112 are 3 kΩ. When the external control voltage $V_C'$ is 2.8 V, the output DC voltage of the differential amplifier which has been delivered through the emitter-follower may be kept at 2.8 V. In this case, the output voltage of the operational amplifier is 1 V and the supply voltage of only the operational amplifier may therefore be set at 5 V. Then, all consumption currents of the circuit including the operational amplifier is given by $$400(\mu A) \times 3 + 200(\mu A) + 1(mA) = 2.4(mA)$$

and the power consumption thereof is also given by $$2.4(mA) \times 5 = 12.0(mW).$$

Consequently, by comparing the invention with the prior art, the embodiment of the composite differential amplifier according to the invention allows reduction of power consumption upto 5.0 (mW).

Figure 3:
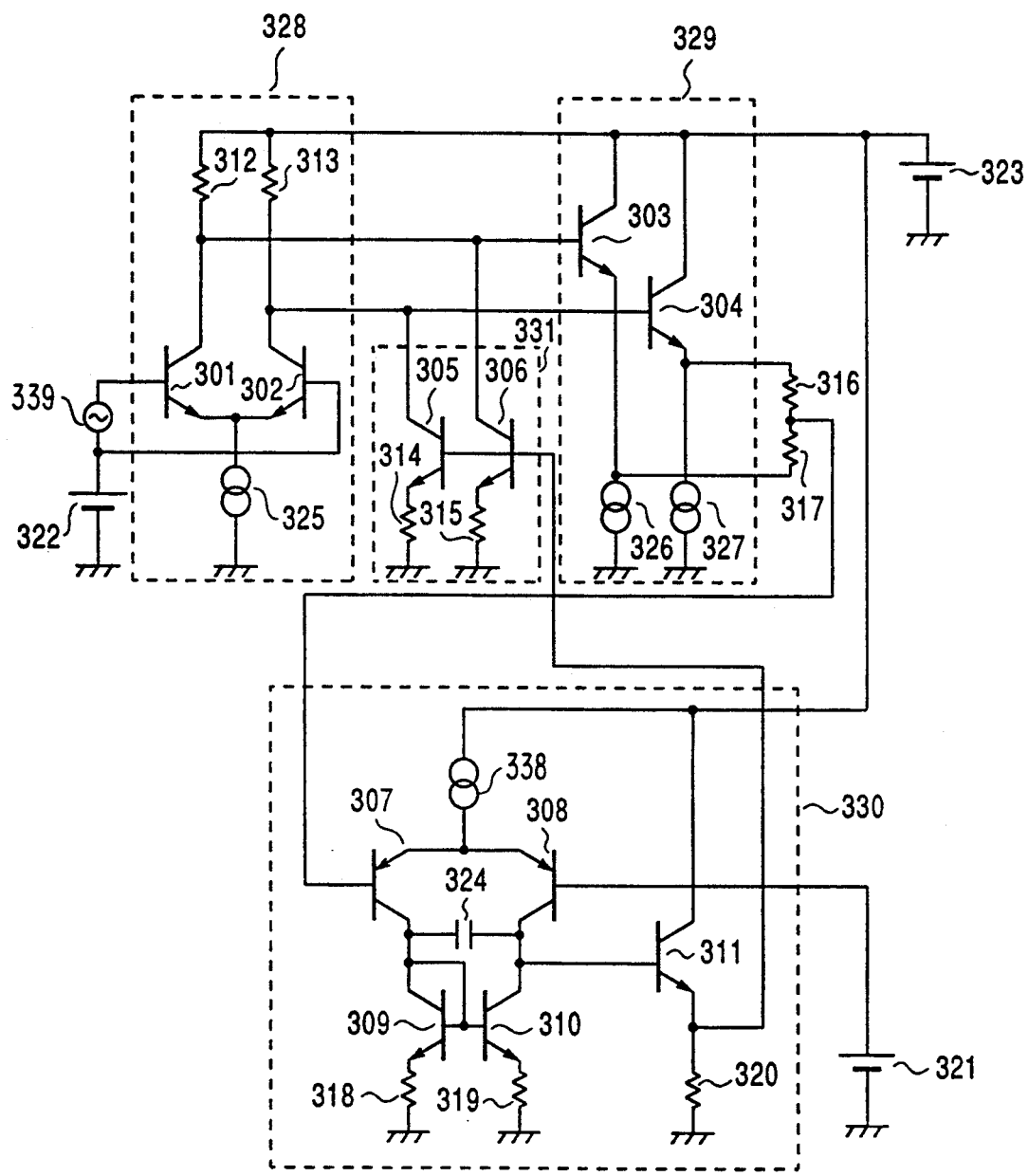
FIG. 3 is a circuit diagram of a further more concrete embodiment of FIG. 2 of a composite differential amplifier according to the invention, in which one embodiment of a circuit diagram of an operational amplifier is shown.

Another embodiment of the present invention will be described with reference to FIG. 3. A composite differential amplifier 328, an emitter follower 329, a variable current source, 331, and an operational amplifier 330.

The differential amplifier 328 comprises transistors 301 and 302, resistors 312 and 313, and a constant current source 325. The transistors 301 and 302 are connected at their collector sides to a DC power supply 323 via the resistors 312 and 313, respectively. The transistors 301 and 302 are grounded at their emitter sides via the constant current source 325. The transistors 301 and 302 are connected at their base sides to opposite sides of an input signal source 339, respectively. The input signal source 339 is grounded through an input bias voltage source 322.

The emitter-follower 329 comprises transistors 303 and 304 and constant current sources 326 and 327. The transistors 303 and 304 are connected at their collector sides to the DC power supply 323. The transistors 303 and 304 are also connected at their base sides to the collector sides of the transistors 301 and 302 in the differential amplifier 328. An input side the emitter-follower 329 is connected to an output side of the differential amplifier 328. The transistors 303 and 304 are grounded at their emitter sides through constant current sources 326 and 327. The emitter sides of the transistors 303 and 304 are connected to opposite sides of a series of resistors 316 and 317, respectively. The resistors 316 and 317 have the same resistance value.

The variable current source 331 comprises transistors 305 and 306 and resistors 314 and 315. The transistors 305 and 306 are connected at their collector sides to the collector sides of the transistors 301 and 302 in the differential amplifier 328, and thus the output side of the differential amplifier 328. The transistors 305 and 306 are grounded at their emitter sides through the resistors 314 and 315, respectively.

The operational amplifier 330 comprises transistors 307 and 308, a constant current source 338, a capacitor 324, transistors 309 and 310, resistors 318 and 319, a transistor 311, and a resistor 320. The transistors 307 and 308 are connected at their emitter sides to the DC power supply to the constant current source 338. The transistor 307 is connected at its base side to a middle point between the resistors 316 and 317. The transistor 308 is connected at its base side to a DC power supply 321. The transistors 307 and 308 are coupled to each other at their collector sides through the capacitor 324.

The transistors 309 and 310 are connected at their collector sides to the collector sides of the transistors 307 and 308, respectively. The base sides of the transistors 309 and 310 are directly connected to each other. The transistor 309 has only a short circuit between its collector and base sides. Emitter sides of the transistors 309 and 310 are grounded through the resistors 318 and 319.

The transistor 311 is connected at its collector side to the DC power supply 323, and at its base side to the collector sides of the transistors 308 and 310. The transistor 311 is connected at its emitter side to the base sides of the transistors 305 and 305 in the variable current source 331. Namely, an output side of the operational amplifier 330 is connected to the base sides of the transistors 305 and 306 in the variable current source 331. The emitter side of the transistor 331 is also grounded through the resistor 320.

The differential amplifier 328 receives an input signal from the input signal source 339 for a subsequent amplification of the received signal. The amplified signal from the differential amplifier 328 is transmitted to the emitter-follower 329. The emitter-follower 329 receives the output signal from the differential amplifier 328 for a subsequent amplification of the received signal. The emitter-follower 329 exhibits an output of the signal through the emitter sides of the transistors 303 and 304. As described above, the output side of the emitter-follower 329 is connected to the opposite sides of the series connected resistors 316 and 317 so that a differential output is obtained from the emitter-follower 329. The respective outputs from the transistors 303 and 304 in the emitter follower 329 are added to each other through the series resistors 316 and 317; thus, an alternating-current component of the output signal is eliminated and only a direct-current component of the output signal remains. The output signal from the middle point between the resistors 316 and 317 has the direct-current component.

The output signal from the emitter-follower 329 is transmitted to the operational amplifier 330. At its base side, the transistor 307 receives the output signal from the emitter-follower 329. At its base side, the transistor 308 receives a reference voltage which is supplied from the DC power supply 321.

The operational amplifier 330 compares the direct-current component of the output signal with the reference voltage. When the direct-current component of the output signal is higher than the reference voltage, the output from the operational amplifier 330 increases. This causes an increase in the current through the emitter of the transistor 331. The output from the operational amplifier 330 is transmitted to the variable current source 331. The variable current source 331 receives the increased output from the operational amplifier 330. The variable current source 331 reduces the output from the differential amplifier 328 so that the direct-current component of the output from the emitter-follower approaches the reference voltage. This results in a correspondence of the direct-current component of the output to the reference voltage.

As described above, when a value $V_B$ of the direction-current component of the output is higher than a value $V_{ref}$ of the reference voltage, there are increases in both the output voltage from the operational amplifier 330 and the current $I_D$ through the variable current source 331 which receives the effects provided when both the output voltage and current increases. Thus, the variable current source 331 provides a convergence to the variable output from the operational amplifier 329. Values $V_o$ and $V_o$ of the output voltages from the transistors 301 and 302 are respectively given by $$V_o = V_o + V_{cc} - R_L I_o - I_D,$$

and $$V_o = -V_o + V_{cc} - R_L I_o - I_D.$$

The direct-current component $V_B$ of the output from the emitter-follower is given by $$V_B = \tfrac{1}{2}(V_o + V_o)$$
$$= V_{CC} - R_L I_O - I_D$$

From the above equations, it is understood that the rise of the current $I_D$ to the variable current source 331 makes the direct-current component $V_B$ of the output lower. This accomplishes a feedback system in which the direct-current component of the output approaches the reference voltage and thus results in a correspondence of the direct-current component of the signal to the reference voltage.

When the direct-current component $V_B$ of the output from the emitter-follower 329 is lower than the reference voltage $V_{ref}$, a reduction of the output from the operational amplifier 330 appears, thereby reducting the current $I_D$ to the variable current source 331. From the above equations, it is understood that the reduction of the current $I_D$ increases the direct-current component $V_B$ of the output from the emitter-follower 329. Such a circuit structure may be regarded as a combination of a differential amplifier and an invertor amplifier.

As described above, when the value $V_B$ of the direction-current component of the output is lower than the reference voltage $V_{ref}$, the reduction of both the output voltage from the operational amplifier 330 and the current $I_D$ through the variable current source 331 appear. The variable current source 331 receives effects provided by the reduction of both the output voltage and current. Thus, the variable current source 331 provides a convergence to the variable output from the operational amplifier 329. Values $V_o'$ and $V_o'$ of the output voltages from the transistors 301 and 302 are respectively given by $$V_o' = v_o + V_{cc} - R_L I_o - I_D - V_{BE},$$

and $$V_o' = -v_o + V_{cc} - R_L I_o - I_D - V_{BE}.$$

The direct-current component $V_B$ of the output from the emitter-follower is given by $$V_B = \tfrac{1}{2}(V_o' + V_o')$$
$$= V_{CC} - R_L I_D - I_D - V_{BE}.$$

From the above equations, it is understood that the reduction of the current $I_D$ to the variable current source 331 increases the direct-current component $V_B$ of the output. This accomplishes a negative feedback system so that the direct-current component of the signal approaches the reference voltage, thus resulting in a correspondence of the direct-current component of the signal to the reference voltage.

In the above embodiment, according to the present invention, since the output from the operational amplifier 330 is transmitted through the variable current source 331 to the output side of the differential amplifier 328, it is not necessary to set a high output voltage $V_{op}$ of the operational amplifier, even when a high output DC voltage of the differential amplifier 328 is set. Since the differential amplifier 328 is supplied with the power from the power supply, the circuit is free from an increase of the output current from the operational amplifier 330, and also from an increase of a power consumption of the circuit. Further, a high voltage for the operational amplifier 330 is unnecessary. This makes it easy to reduce a voltage for the circuit including the operational amplifier.

Whereas alternations and modifications of the present invention will no doubt be apparent to a person of ordinary skilled in the art, it is to be understood that the embodiments shown and described by way of illustration are by no means intended to be considered limitation. Accordingly, it is to be intended by the claims to cover all alternations of the invention which fall in the spirit and scope of the invention.

What is claimed is:

1. A composite differential amplifier comprising:
    a power supply for supplying a power to a circuit;
    a differential amplifier for amplifying a voltage signal inputted from an input signal source;
    an emitter-follower connected to an output side of said differential amplifier for converting said voltage signal outputted from said differential amplifier into a DC voltage and for amplifying said voltage outputted from said differential amplifier 120;
    an operational amplifier connected to an output side of said emitter-follower for amplifying said DC voltage outputted from said emitter-follower; and
    a variable current source connected to an output side of said operational amplifier and connected to said output side of said differential amplifier for controlling a voltage of said output side of said differential amplifier in response to an output of said operational amplifier.

2. A composite differential amplifier as claimed in claim 1, wherein said emitter-follower comprises;
    a first means connected to a first side in said output side of said differential amplifier for amplifying said voltage signal from said first side and for converting said voltage signal from said first side into a DC voltage; and
    a second means connected to a second side in said output side of said differential amplifier for amplifying said voltage signal from said second side and for converting said voltage signal from said second side into a DC voltage.

3. A composite differential amplifier as claimed in claim 2, wherein said emitter-follower further comprises:
    a plurality of resistances for providing said operational amplifier with a middle-point-voltage between said DC voltage outputted from said first means of said emitter-follower and said DC voltage outputted from said second means of said emitter-follower.

4. A composite differential amplifier as claimed in claim 2, wherein said first means of said emitter-follower comprises:
    a transistor in which the emitter is connected to said input side of said operational amplifier, the collector is connected to said power supply and the base is connected to said first side in said output side of said differential amplifier; and
    a constant current source for providing a constant emitter current of said transistor.

5. A composite differential amplifier as claimed in claim 2, wherein said second means of said emitter-follower comprises:
    a transistor in which the emitter is connected to said input side of said operational amplifier, the collector is connected to said power supply and the base is connected to said first side in said output side of said differential amplifier; and
    a constant current source for providing a constant emitter current of said transistor.

6. A composite differential amplifier as claimed in claim 1, wherein in said operational amplifier, an inverting input terminal is connected to an external control power supply, a non-inverting input terminal is connected to an emitter side of each transistor of said emitter-follower through resistances of said emitter-follower; and
    an output terminal is connected to an input side of said variable current source.

7. A composite differential amplifier as claimed in claim 1, wherein said variable current source comprises:
    a first means connected to said output side of said operational amplifier and connected to a first side in said output side of said differential amplifier for controlling a voltage of said first side in said output side of said differential amplifier in response to said output side of said operational amplifier; and
    a second means connected to said output side of said operational amplifier and connected to a second side in said output side of said differential amplifier for controlling a voltage of said second side in said output side of said differential amplifier in response to said output of said operational amplifier.

8. A composite differential amplifier as claimed in claim 7, wherein said first means of said variable current source comprises a transistor in which the emitter is connected to the ground through a resistance, the collector is connected to said first side in said output side of said differential amplifier, the base is connected to said output side of said operational amplifier.

9. A composite differential amplifier as claimed in claim 7, wherein said second means of said variable current source comprises a transistor in which the emitter is connected to the ground through a resistance, the collector is connected to said first side in said output side of said differential amplifier, the base is connected to said output side of said operational amplifier.

* * * * *